US012690361B2

(12) United States Patent
Huang

(10) Patent No.: US 12,690,361 B2
(45) Date of Patent: Jul. 21, 2026

(54) STRUCTURE AND METHOD TO PROVIDE SUPPORT FOR FLEXIBLE DISPLAY

(71) Applicant: Dell Products L.P., Round Rock, TX (US)

(72) Inventor: Hong-Ji Huang, Taiwan (TW)

(73) Assignee: Dell Products L.P., Round Rock, TX (US)

( * ) Notice: Subject to any disclaimer, the term of this patent is extended or adjusted under 35 U.S.C. 154(b) by 431 days.

(21) Appl. No.: 18/226,913

(22) Filed: Jul. 27, 2023

(65) Prior Publication Data

US 2025/0040400 A1    Jan. 30, 2025

(51) Int. Cl.
*H10K 59/80* (2023.01)
*H10K 59/12* (2023.01)
(52) U.S. Cl.
CPC ............. *H10K 59/80* (2023.02); *H10K 59/12* (2023.02)

(58) Field of Classification Search
CPC .............................. H10K 59/80; H10K 59/12
See application file for complete search history.

(56) References Cited

U.S. PATENT DOCUMENTS

2016/0064466 A1* 3/2016 Son ................... H10K 59/8791
445/24

* cited by examiner

*Primary Examiner* — Jeremy C Norris
(74) *Attorney, Agent, or Firm* — Terrile, Cannatti & Chambers, LLP; Emmanuel A. Rivera

(57) ABSTRACT

Described herein are a structure and method for to provide support for a flexible display of an information handling system. Several layers of the flexible display are stacked with a metal foil. The metal foil provides support and bending as defined by design requirements of the flexible display. Particular areas of the metal foil have specific thickness and/or density based on the design requirements. The bending area is allowed to be bent or folded over with thickness and/or density to allow such.

17 Claims, 7 Drawing Sheets

200

202

204

206

208

210

402

404

**602

700

STRUCTURE AND METHOD TO PROVIDE SUPPORT FOR FLEXIBLE DISPLAY

BACKGROUND OF THE INVENTION

Field of the Invention

The present invention relates to information handling systems. More specifically, embodiments of the invention provide for a structure and method to provide support and bending of flexible displays of information handling systems.

Description of the Related Art

As the value and use of information continues to increase, individuals and businesses seek additional ways to process and store information. One option available to users is information handling systems. Information handling systems include personal computers (PC), server computers, desktop computers, notebooks, laptops, etc. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated.

Information handling systems, such as smartphones, tablets, notebook or laptop computers, etc. make use of displays to provide video. Such displays include flexible displays that can be bent and folded to provide a compact form when the display is not in use.

A flexible display, such as organic light-emitting diode (OLED) displays can be constructed of several layers, including a substrate layer that provides support for the other layers, a thin film transistor (TFT) layer that controls power to pixels of an OLED layer, the OLED layer that includes individual pixels, and a cover layer made of a plastic or ultra-thin glass that protects the other layers.

Implementations can provide for a metal frame to be used to support the various layers, including the plastic or glass cover layer. The metal frame can also be used to protect parts on the backside of the display. Such a metal frame may be about 8 mm in thickness, and may be too thick to be folded/bent. Typically, the metal frame may be constructed with several pieces. The thickness, weight, and construction of the metal frame may be limited/constrained to particular system design considerations. Weight, thickness, and construction of the metal frame is not easily changed. A hinge is provided with the metal frame to allow the display to fold.

The metal frame should be suitable to support and protect parts of the display on the backside. The metal frame can limit system design of the display.

As the display is bent and folded, the layers at the folded area of the display may hang freely. If torque on the hinge is not balanced, the cover layer (i.e., plastic or ultra-thin glass layer) used to protect the other layers can deform, and damage the other layers.

SUMMARY OF THE INVENTION

A support structure for a flexible display of an information handling system comprising a metal foil stacked up with the multiple layers, wherein the metal foil comprises a bending area as defined by design requirements of the flexible display; and other areas as defined the design requirements, wherein the bending area and other areas have particular thicknesses and/or densities based on the design requirements.

A method providing support and bending of flexible displays of information handling systems comprising determining design requirements are determined for the flexible display; determining bending area of the flexible display; forming thickness and/or density at particular areas of a metal foil based on the design requirements; attaching the metal foil to the various layers of the flexible display in a stacked order.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Implementations provide for a flexible display as used in an information handling system to include a thin metal foil used to provide support for various layers and components of the flexible display. The metal foil can be placed on the backside of the flexible display in a stacked up configuration with the various layers.

The metal foil in certain implementations is used in place of a metal frame and hinge. The metal foil can be constructed from various metals, such as stainless steel, titanium, aluminum, etc. Other materials can be used which provide support and flexibility.

Thickness of metal foil can vary depending on location and system design requirements for the flexible display. For example, at certain locations thickness can be thicker to provide additional support. At certain locations, such as the bending area of the flexible display, thickness can be thinner to provide adequate bending and flexibility (e.g., based on natural plane of bending/rolling curve). Example thickness variance can range from 0.025 mm to 0.25 mm. Thicknesses of metal foil can be predefined.

Implementations provide for the metal foil to include microstructures. Such microstructures can be defined for specific areas of the metal foil, such as to provide different curvature to support different design requirements.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a smartphone, tablet, personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a microphone, keyboard, a video display, a mouse, etc. The information handling system may also include one or more buses operable to transmit communications between the various hardware components.

Figure 1:
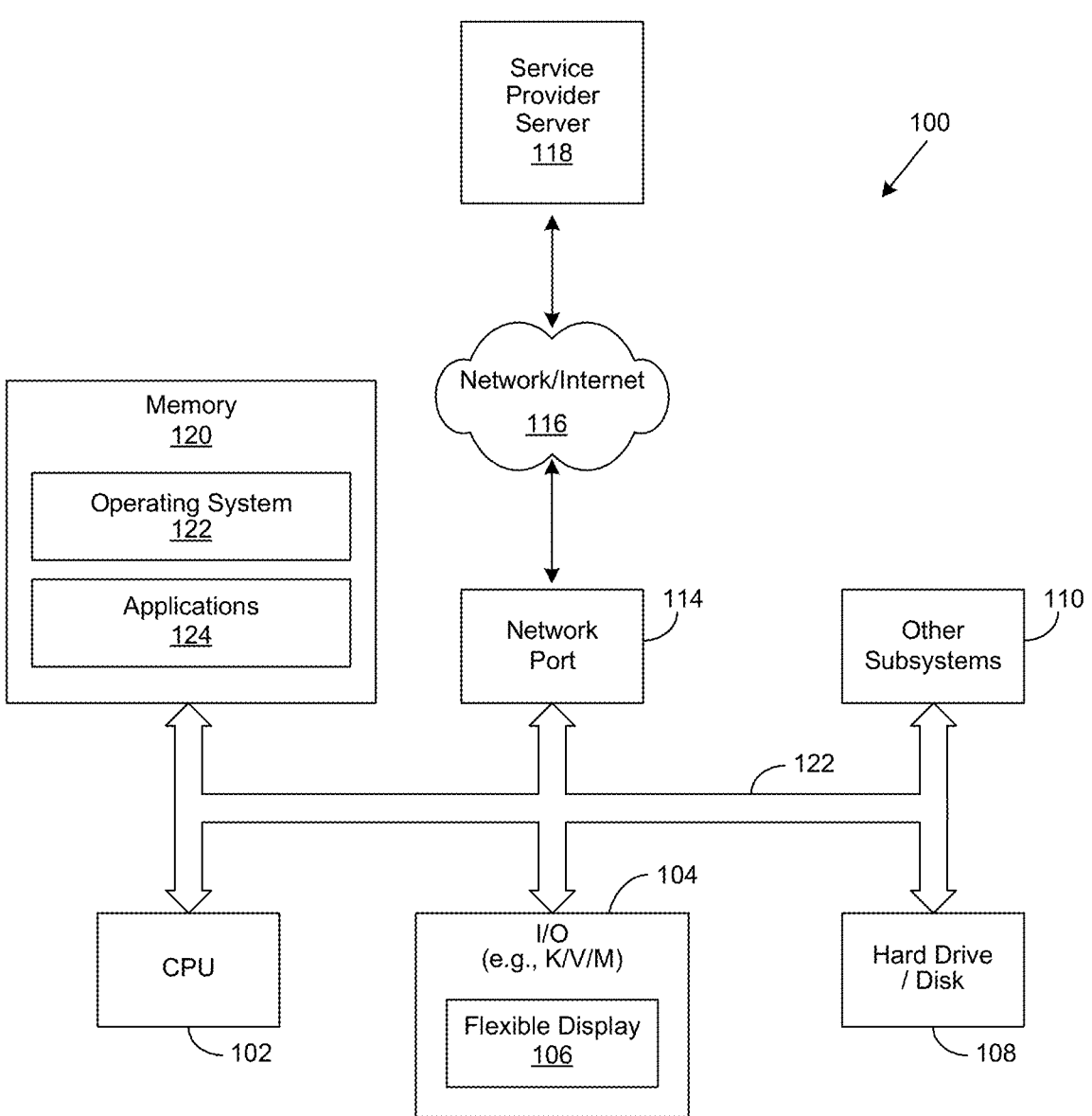
FIG. 1 is a general illustration of an information handling system to implement the system and method of the present invention.

FIG. 1 is a generalized illustration of an information handling system 100 that can be used to implement the system and method of the present invention. The information handling system 100 can be implemented as a computing device, such as a laptop computer, desktop computer, etc.

The information handling system 100 includes a processor (e.g., central processor unit or "CPU") 102. Implementations further provide for other processors and controllers, including application specific controllers (e.g., memory controller). The information handling system 100 includes input/output (I/O) devices 104, such as a microphone, a keyboard, a video/display, a mouse, and associated controllers (e.g., K/V/M). In particular, I/O devices 104 can include a flexible display 106 as further described herein.

The information handling system 100 includes a hard drive or disk storage 108, and various other subsystems 110. In various embodiments, the information handling system 100 also includes network port 114 operable to connect to a network 116 described herein, where network 116 can include one or more wired and wireless networks, including the Internet. Network 116 is likewise accessible by a service provider server 118.

The information handling system 100 likewise includes system memory 120, which is interconnected to the foregoing via one or more buses 122. System memory 120 can be implemented as hardware, firmware, software, or a combination of such (e.g., RAM, ROM, DIMM, etc.).

System memory 120 further includes an operating system (OS) 122. Embodiments provide for the system memory 120 to include applications 124. Applications 124 can be implemented as software or firmware, and can be downloaded or preprogrammed.

Figure 2:
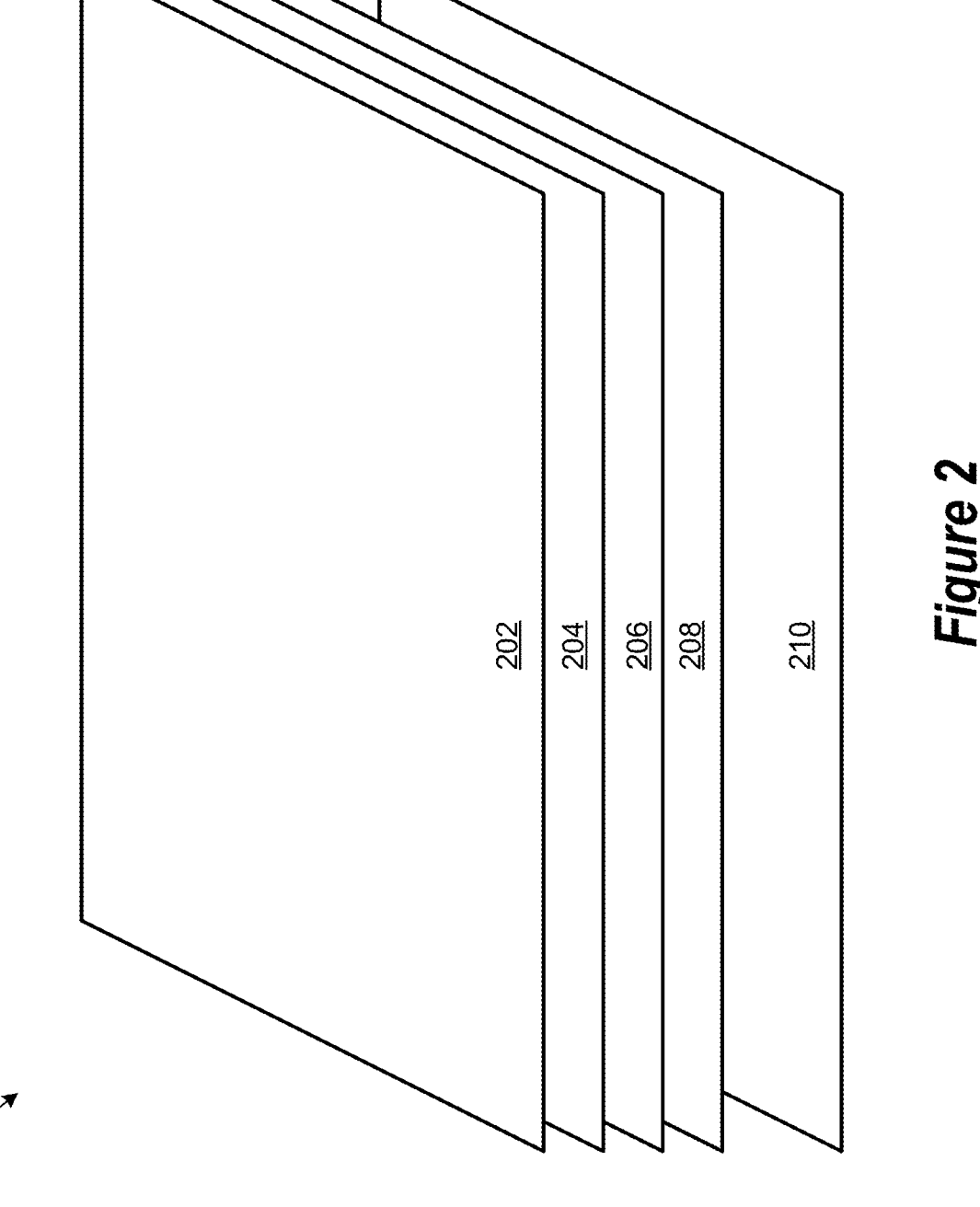
FIG. 2 illustrates a structure to provide support for a flexible display.

FIG. 2 shows a structure 200 to provide support for a flexible display. The structure 200 can be implemented as part of a flexible display such as flexible display 106 described in FIG. 1.

The structure 200 can include various layers of the flexible display. For example, the various layers can include a glass/plastic layer 202, an OLED layer 204, a TFT layer 206, and a substrate layer 208. Other implementations can include other layers. The various layers are configured to be flexible to be bent or folded at certain locations.

A metal foil layer 210 is included in structure 200. The metal foil layer 200 can be constructed from various metals, such as stainless steel, titanium, aluminum, etc. Other materials can be used which provide support and flexibility.

Thickness or density of metal foil layer 210 can vary depending on location and system design requirements for the flexible display. For example, at certain locations thickness or density can be thicker (denser) to provide additional support. At certain locations, such as the bending area of the flexible display, thickness can be thinner or density less to provide adequate bending and flexibility. Density and/or thickness of metal foil layer 210 can be predetermined and processed using various techniques, including etching and stenciling.

Figure 3:
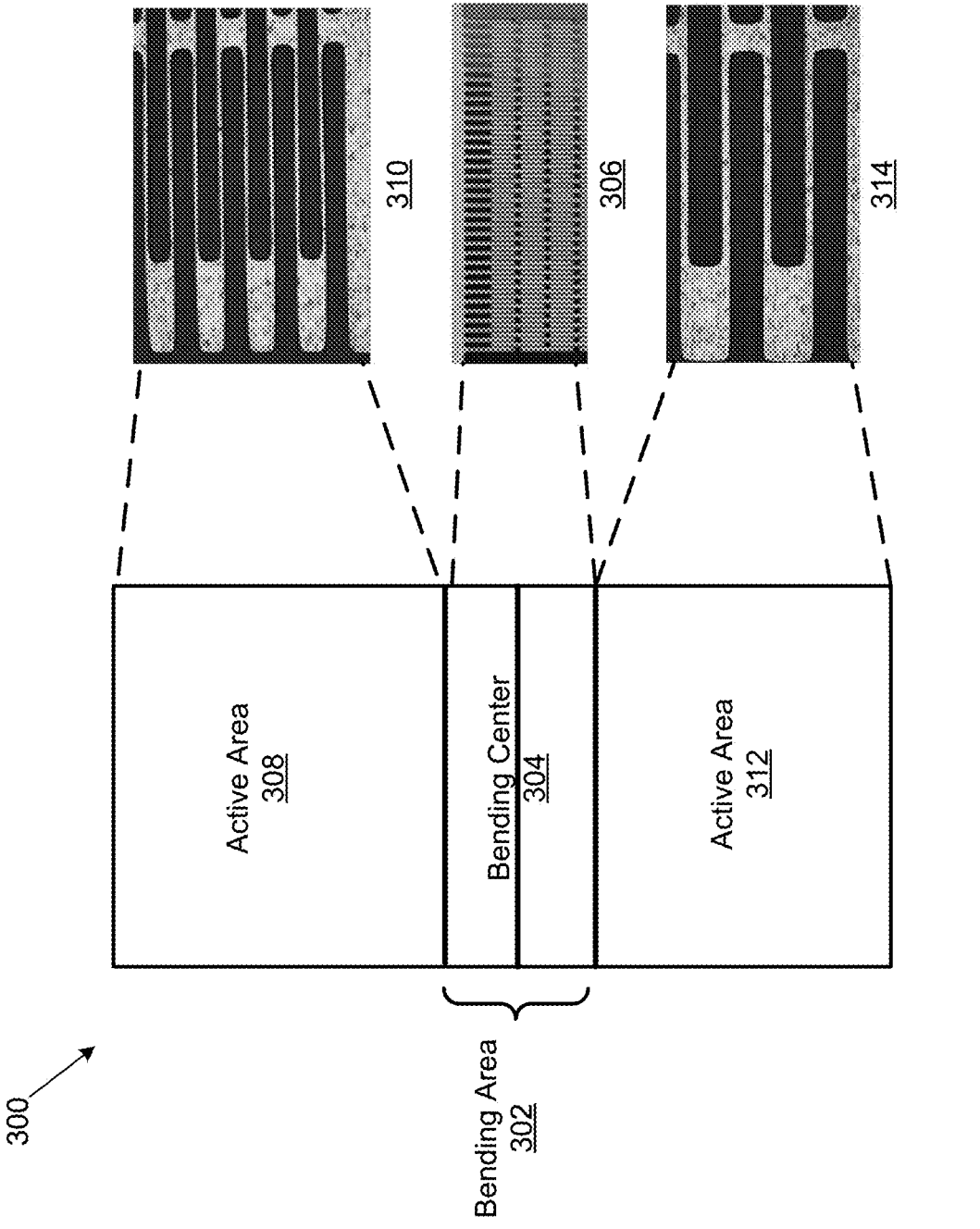
FIG. 3 illustrates varying density for a metal foil layer based on location and/or design requirements.

FIG. 3 shows varying density 300 for metal foil layer 210 based on location and/or design requirements. At certain locations of metal foil layer 210 thickness can be thicker or less than other locations of the metal foil layer 210. Thickness or density can be determined based on system design requirements and/or bending/folding requirements at a particular location.

For example, for locations where greater support is needed, greater thickness or density can be provided. For locations, where bending/folding is performed thickness or density can be less to allow for adequate bending/folding.

In the example shown in FIG. 3, a bending area 302 is provided. The bending area is where a flexible display is bent or folded over. The bending area 302 includes a bending center 304. The bending area 302 can be configured to have a particular thickness, or a density 306. Density 306 can be relatively low compared to other areas. Further the density 306 can vary as to curvature of the bending area 302. In other words, density at the bending center 304 can be less than the other outer areas of the bending area 302 to accommodate for greater bending.

Other areas, such as active area 308 may not require bending or folding, and may also have requirements to provide added support. In this example active area 308 has a greater density 310 than bending area 304 with density 308. In this example active area 312 may require a greater density 313 than density 310.

Figure 4:
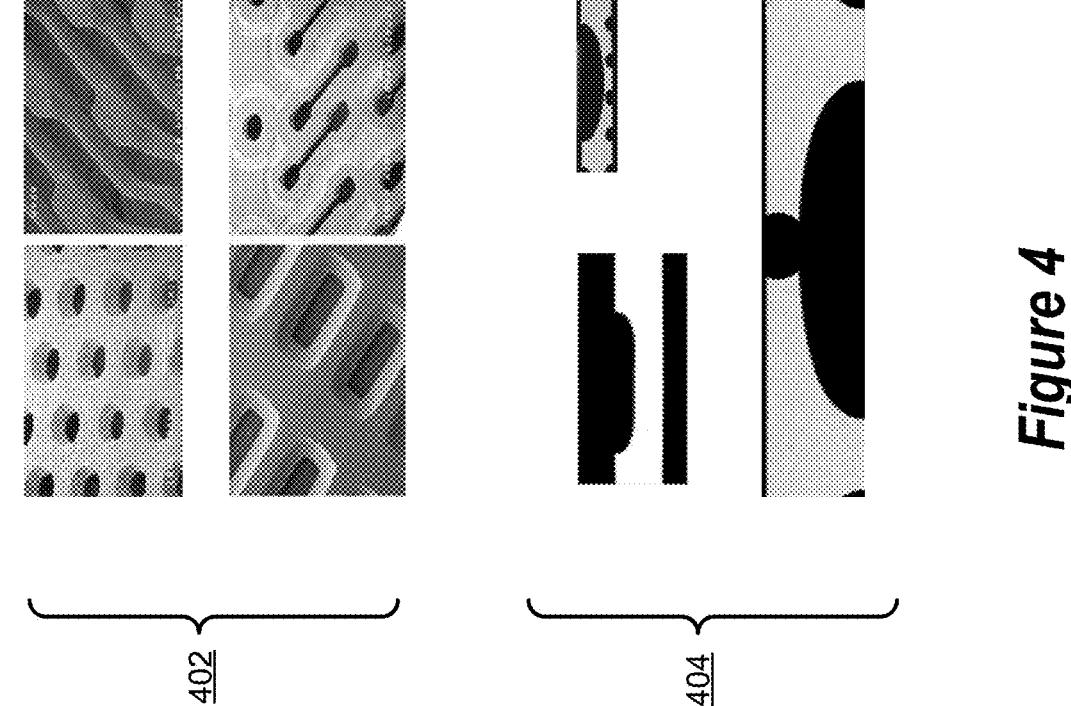
FIG. 4 illustrates microstructures that can be included in a metal foil layer.
Figure 4:
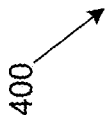

FIG. 4 shows example microstructures 400 that can be included in a metal foil layer 210. The microstructures 400 support design requirements for particular applications of the flexible display. The microstructures 400 can be formed using various techniques, including etching and stenciling.

In this example, microstructures 402 can be shaped as oblique structures. Such oblique structures can be implemented to provide deposition uniformity and pixel density of a flexible display.

Furthermore, microstructures 400 can be developed to provide for dual side, depth, and partial opening as shown in 404. This provision can be for particular design or application requirements of the flexible display.

Figure 5:
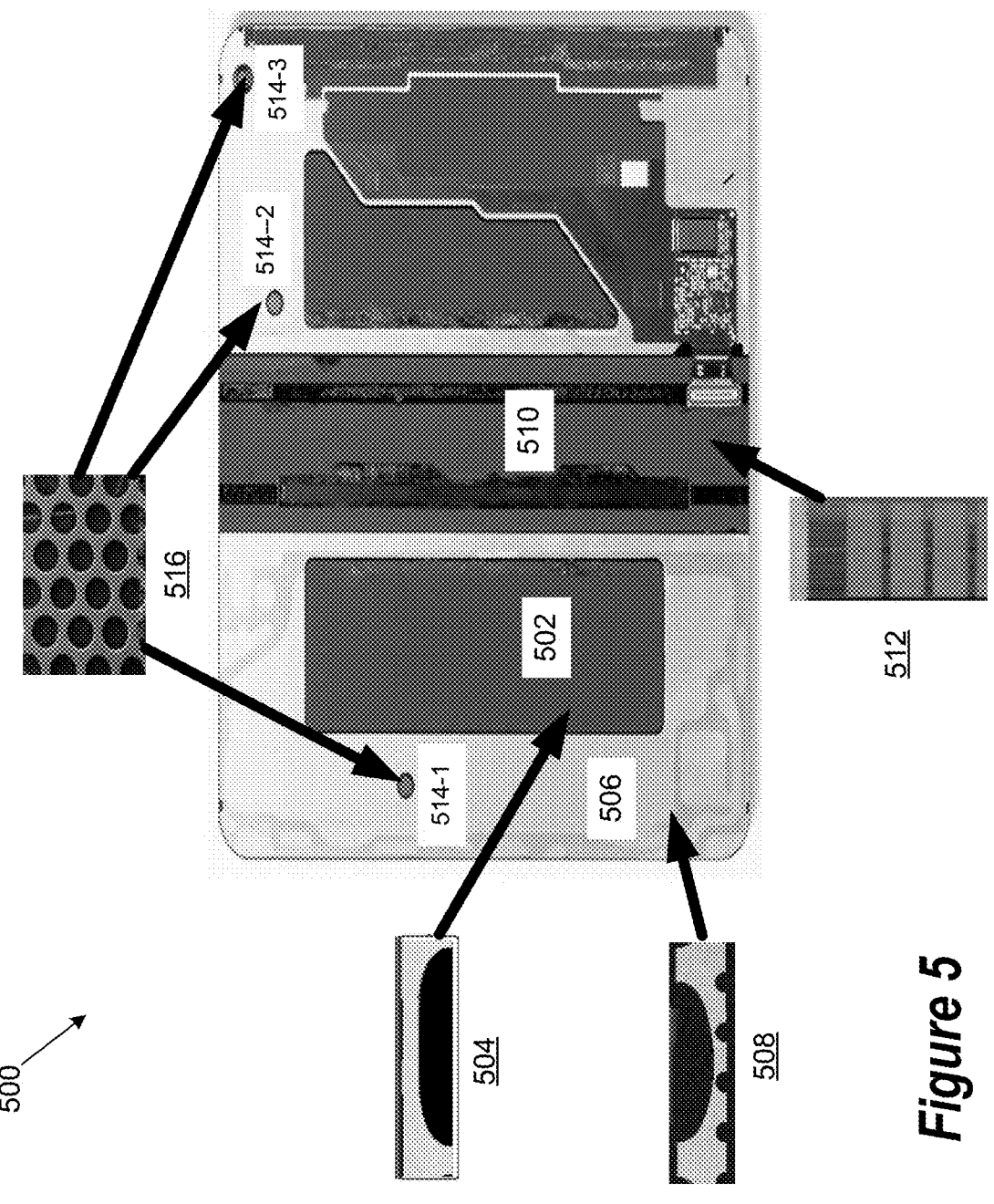
FIG. 5 illustrates an implementation of metal foil layer supporting different system design requirements for a flexible display.

FIG. 5 shows an example implementation 500 of metal foil layer 210 supporting different system design requirements for flexible display. The example implementation 500 can provide for multiple designs integrated on metal foil layer 210. Furthermore, stiffness of the metal foil layer 210 can be optimized with consideration of system design requirements and providing for the multiple designs.

For example, a thermal pad/shielding foil area 502 may be a system design requirement. Local thinning 504 can be provided, wherein the local thinning 504 is relatively thicker than in other areas of the metal foil layer 210. In areas such as 506, local thinning 508 is relatively thinner or less dense to provide some overall weight reduction.

For a bending area 510, a relatively less dense area 512 can be provided as discussed in FIG. 3. Design requirements may call for sensor areas 514-1, 514-2, and 514-3. Structures or openings 516 can be provided to support the sensor areas

514-1, 514-2, and 514-3. Aspect ratio of the openings 516 can be configured to the sensor areas 514-1, 514-2, and 514-3.

Figure 6:
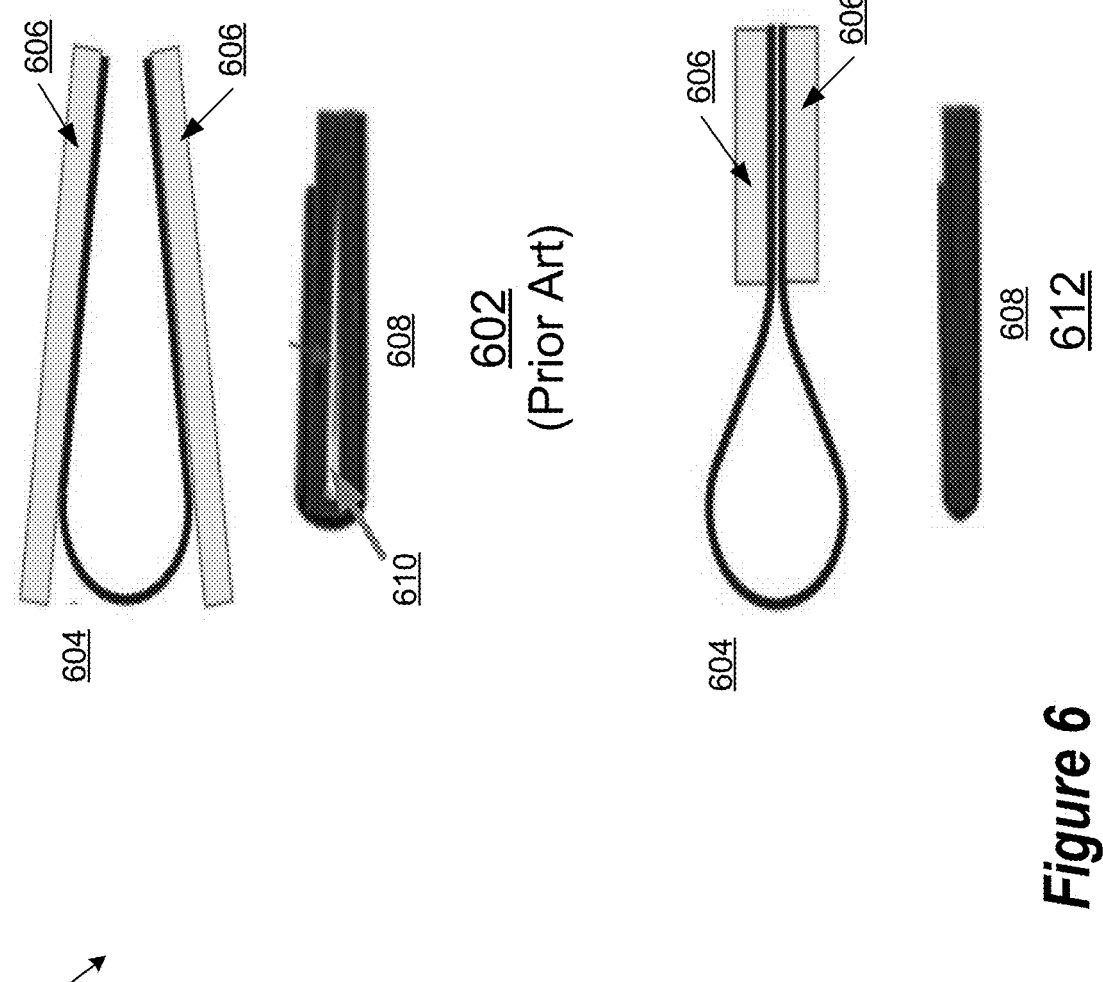
FIG. 6 illustrates implementations with a commonly used steel plate and a metal foil layer.

FIG. 6 shows a comparison 600 of implementations with a commonly used steel plate and a metal foil layer as described herein. 602 shows a prior art implementation where a steel plate is used to provide support to the various layers 604 of a flexible display with a housing 606. Such a steel plate can be homogenous in thickness and designed as a comprise for support and foldability/bendability. In the implementation of 602, when the display is folded, the metal plate prevents the housing to fully enclose the various layers 604. The steel plate creates a stack up that prevents the housing to fully enclose the various layers 604. As shown in 608, a gap 610 exists when the flexible display is folded.

In contrast, as shown in 612 where a metal foil layer having varying thicknesses and densities, provision is made to allow the various layers 604 to bend and the housing 606 to fully enclose the various layers 604. The metal foil layer foregoes the stack up of the steel plate. No gap is present in 608.

Figure 7:
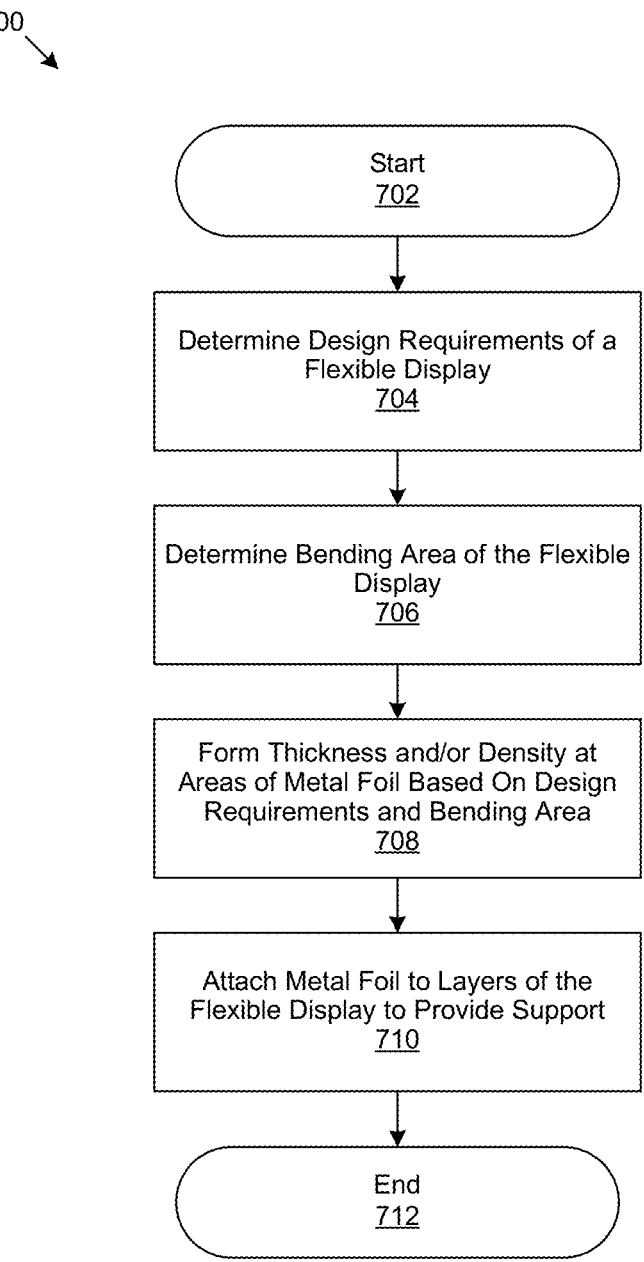
FIG. 7 is a generalized flowchart for support and bending of flexible displays of information handling systems.

FIG. 7 is a generalized flowchart 700 for support and bending of flexible displays of information handling systems. The order in which the method is described is not intended to be construed as a limitation, and any number of the described method steps may be combined in any order to implement the method, or alternate method. Additionally, individual steps may be deleted from the method without departing from the spirit and scope of the subject matter described herein. Furthermore, the method may be implemented in any suitable hardware, software, firmware, or a combination thereof, without departing from the scope of the invention.

At step 702 the process 700 starts. At step 704, design requirements are determined for the flexible display. Design requirements can include micro-structures, etc. that support particular applications of the flexible display.

At step 706, the bending area of the flexible display is determined. The bending area can include different degrees of curvature or bending.

At step 708, thickness and/or density is formed at particular areas of a metal foil based on the design requirements and the bending area.

At step 710, the metal foil is attached to various layers of the flexible display in a stacked form. The metal foil provides support to the various layers, and allows for bending and folding. At step 712, the process 700 ends.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a microphone, keyboard, a video display, a mouse, etc. The information handling system may also include one or more buses operable to transmit communications between the various hardware components.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object-oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer\implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Skilled practitioners of the art will recognize that many such embodiments are possible, and the foregoing is not intended to limit the spirit, scope or intent of the invention. Consequently, the invention is intended to be limited only by the spirit and scope of the appended claims, giving full cognizance to equivalents in all respects.

What is claimed is:

1. A support structure for a flexible display of an information handling system comprising:
   multiple layers included in the flexible display;
   a metal foil stacked up with the multiple layers, wherein the metal foil comprises:
      a bending area as defined by design requirements of the flexible display; and
      other areas as defined the design requirements, wherein the bending area and other areas have particular thicknesses and/or densities based on the design requirements, wherein the design requirements provide for oblique micro structures on the metal foil.

2. The support structure claim 1, wherein the multiple layers include a glass/plastic layer, an OLED layer, a TFT layer, and a substrate layer.

3. The support structure claim 1, wherein the metal foil is comprised of stainless steel, titanium, aluminum, or other bendable material.

4. The support structure of claim 1, wherein the micro structures are developed on the metal foil for dual side, depth, and partial openings.

5. The support structure of claim 1, wherein the bending area has varying thickness and/or density based on curvature.

6. The support structure of claim 1, wherein the various layers and metal foil are fully enclosed when folded.

7. An information handling system comprising:
   a flexible display that comprises:
      multiple layers;
      a metal foil stacked up with the multiple layers, wherein the metal foil comprises:
         a bending area as defined by design requirements of the flexible display; and
         other areas as defined the design requirements, wherein the bending area and other areas have particular thicknesses and/or densities based on the design requirements, wherein the design requirements provide for oblique micro structures on the metal foil.

8. The information handling system of claim 7, wherein the multiple layers include a glass/plastic layer, an OLED layer, a TFT layer, and a substrate layer.

9. The information handling system of claim 7, wherein the metal foil is comprised of stainless steel, titanium, aluminum, or other bendable material.

10. The information handling system of claim 7, wherein the micro structures are developed on the metal foil for dual side, depth, and partial openings.

11. The information handling system of claim 7, wherein the bending area has varying thickness and/or density based on curvature.

12. The information handling system of claim 7, wherein the various layers and metal foil are fully enclosed when folded.

13. A method for providing support and bending of flexible displays of information handling systems comprising:
   determining design requirements are determined for the flexible display, wherein the design requirements provide for oblique micro structures on the metal foil;
   determining bending area of the flexible display;
   forming thickness and/or density at particular areas of a metal foil based on the design requirements;
   attaching the metal foil to the various layers of the flexible display in a stacked order.

14. The method of claim 13, wherein the micro structures are etched or stenciled into the metal foil.

15. The method of claim 13, wherein the micro structures are shaped as oblique structures to provide deposition uniformity and pixel density of the flexible display.

16. The method of claim 13, wherein the bending area includes different degrees of curvature or bending.

17. The method of claim 13, wherein the attaching the metal foil is at the backside of the stacked order.

* * * * *